United States Patent
Hanson et al.

(10) Patent No.: US 10,241,134 B2
(45) Date of Patent: *Mar. 26, 2019

(54) METER BOX GROUNDING CLAMP

(71) Applicant: PPC Broadband, Inc., East Syracuse, NY (US)

(72) Inventors: Brian K. Hanson, Cicero, NY (US); Andrew M. Haberek, Baldwinsville, NY (US)

(73) Assignee: PPC BROADBAND, INC., East Syracuse, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/949,777

(22) Filed: Apr. 10, 2018

(65) Prior Publication Data

US 2018/0231584 A1    Aug. 16, 2018

Related U.S. Application Data

(63) Continuation of application No. 15/212,811, filed on Jul. 18, 2016, now Pat. No. 9,945,885.

(60) Provisional application No. 62/193,912, filed on Jul. 17, 2015.

(51) Int. Cl.
   *H01R 4/64*     (2006.01)
   *G01R 11/02*    (2006.01)

(52) U.S. Cl.
   CPC .............. *G01R 11/02* (2013.01); *H01R 4/64* (2013.01)

(58) Field of Classification Search
   CPC .................................. H01R 4/64; G01R 11/02
   USPC .............................................................. 439/92
   See application file for complete search history.

(56) References Cited

U.S. PATENT DOCUMENTS

| | | |
|---|---|---|
| 2,875,934 A | 3/1959 | Barg |
| 4,904,193 A | 2/1990 | Graves |
| 5,006,074 A * | 4/1991 | Franks, Jr. ......... B23K 37/0435 439/433 |
| 5,114,354 A * | 5/1992 | Franks, Jr. ......... B23K 37/0435 439/433 |
| 5,160,271 A * | 11/1992 | Franks, Jr. ......... B23K 37/0435 439/803 |
| D408,362 S | 4/1999 | Coll |
| 7,044,754 B2 | 5/2006 | Malin |
| 7,122,739 B2 | 10/2006 | Franks, Jr. |
| 7,309,263 B2 | 12/2007 | Copper et al. |
| D577,977 S | 10/2008 | Hernandez |
| 7,997,943 B2 | 8/2011 | Gregory et al. |

* cited by examiner

*Primary Examiner* — Harshad C Patel
(74) *Attorney, Agent, or Firm* — Oliff PLC

(57) ABSTRACT

An adjustable clamping device for mechanical and electrical connection to sides of a conductor includes a first clamping member having a first base and a first arm, a second clamping member having a second base and a second arm, and a coupling member configured to adjustably couple the first clamping member with the second clamping member such that the first arm is spaced from the second arm by a desired distance. The coupling member is also configured to prevent decoupling of the first clamping member from the second clamping member.

18 Claims, 4 Drawing Sheets

METER BOX GROUNDING CLAMP

CROSS-REFERENCE TO RELATED APPLICATION

This application is a continuation of U.S. patent application Ser. No. 15/212,811, filed Jul. 18, 2016, pending, which claims the benefit of U.S. Provisional Application No. 62/193,912, filed Jul. 17, 2015, which is incorporated herein by reference.

TECHNICAL FIELD

The present disclosure relates to a grounding clamp for mechanical and electrical connection to conductors of varying lengths, such as hollow metal boxes. More particularly, the present disclosure relates to an adjustable meter box grounding clamp.

BACKGROUND

Conventional clamping devices for providing an electrical connection to a conductor include various clamps and forms of strap connectors. Conventional clamps typically have first and second arms that extend at a fixed distance from each other from a base. The arms and base form a C-shape or a U-shape, with the arms being positioned adjacent two end surfaces of the conductor. The base can be positioned against or slightly away from a front or side surface of the conductor. The clamp can be attached to the conductor through one or more mechanisms once the clamp is placed on the conductor.

In some conventional clamps, the first and second arms are rigidly fixed on a base having a fixed length, with the distance between the arms thus also being fixed. As a result, these clamps have a predetermined limited range of widths, generally equal to the length of an adjustment screw.

For example, conventional C-shaped clamps include a screw-like member with an abrading tip that is threaded through one of the arms of the C-shaped clamp. The screw member is threaded through the end of the C-shaped clamp into pressured contact with the meter box, with its abrading tip shaped to cut through the outer protective coating of the meter box to establish electrical contact with the metal beneath the coating.

However, conductors have many different shapes and dimension, thus limiting the utility of fixed-length clamps. Therefore, it may be desirable to provide an adjustable length clamp that provides a broad range of operational lengths. It may also be desirable to provide a meter box grounding clamp that is easily adjustable with a single hand to assist a user.

SUMMARY

According to various aspects of the disclosure, an adjustable clamping device for mechanical and electrical connection to sides of a conductor includes a first clamping member having a first base and a first arm, a second clamping member having a second base and a second arm, and a coupling member configured to adjustably couple the first clamping member with the second clamping member such that the first arm is spaced from the second arm by a desired distance. The coupling member is also configured to prevent decoupling of the first clamping member from the second clamping member.

According to some aspects of the disclosure, an adjustable clamping device for mechanical and electrical connection to sides of a conductor includes a first clamping member having a first base and a first arm, a second clamping member having a second base and a second arm, and a coupling member configured to adjustably couple the first clamping member with the second clamping member such that the first arm is spaced from the second arm by a desired distance. The first clamping member and the second clamping member are slidable relative to one another while being coupled together such that the desired distance between the first arm and the second arm is adjustable between a plurality of discrete predetermined distances In accordance with various aspects, an adjustable clamping device for mechanical and electrical connection to sides of a conductor includes a first clamping member having a first base and a first arm, and a second clamping member having a second base and a second arm. The device includes a coupling member configured to adjustably couple the first clamping member with the second clamping member such that the first arm is spaced from the second arm by a desired distance selected from a plurality of discrete distances, and an adjustment member configured to provide a continuous range of adjustment between the plurality of discrete distances.

DETAILED DESCRIPTION OF EMBODIMENTS

The following detailed description refers to the accompanying drawings. The same reference numbers in different drawings may identify the same or similar elements. Also, the following detailed description does not limit the invention.

Figure 1:
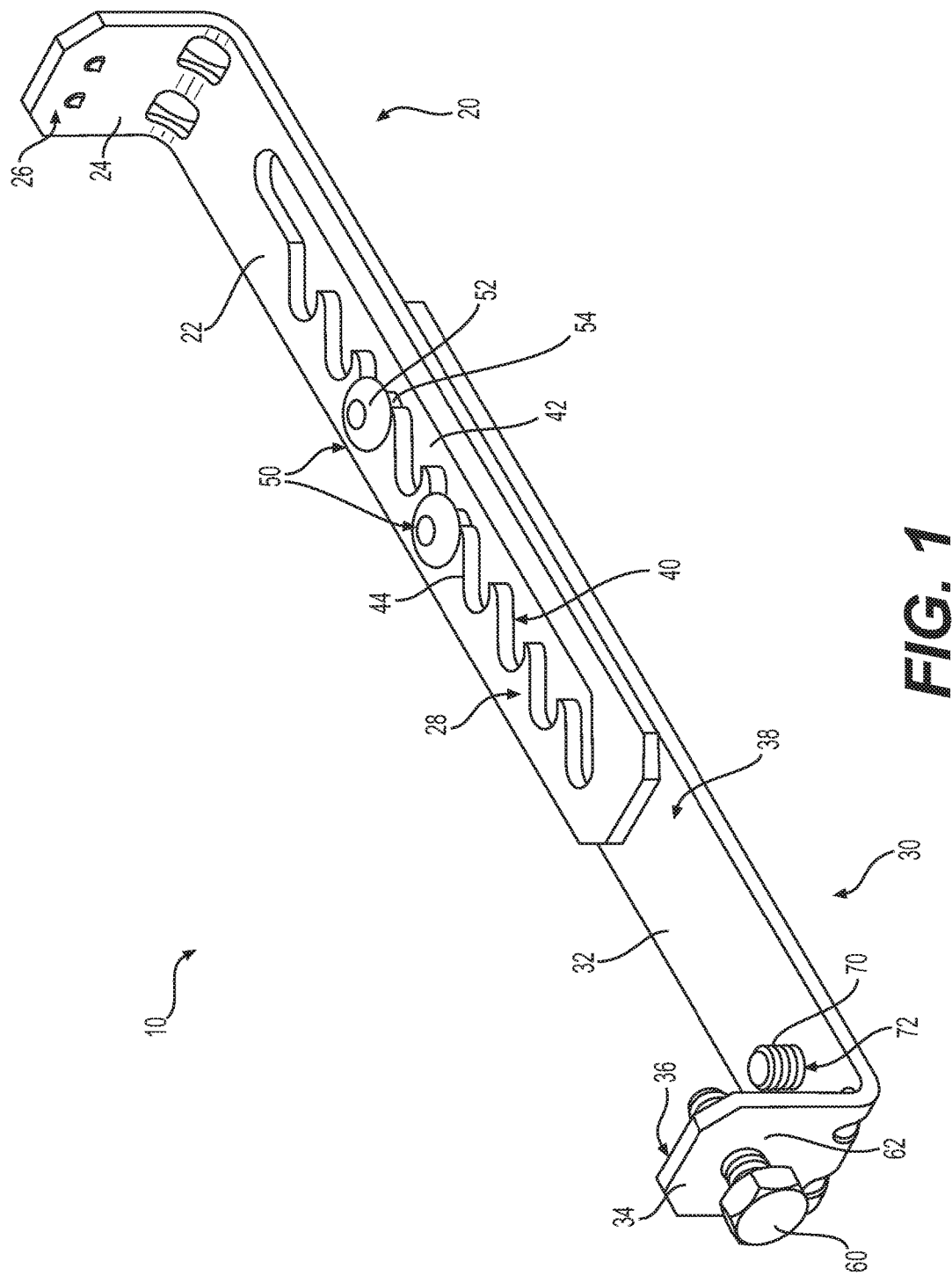
FIG. 1 is a perspective view of an exemplary meter box grounding clamp in accordance with various aspects of the disclosure.
Figure 2:
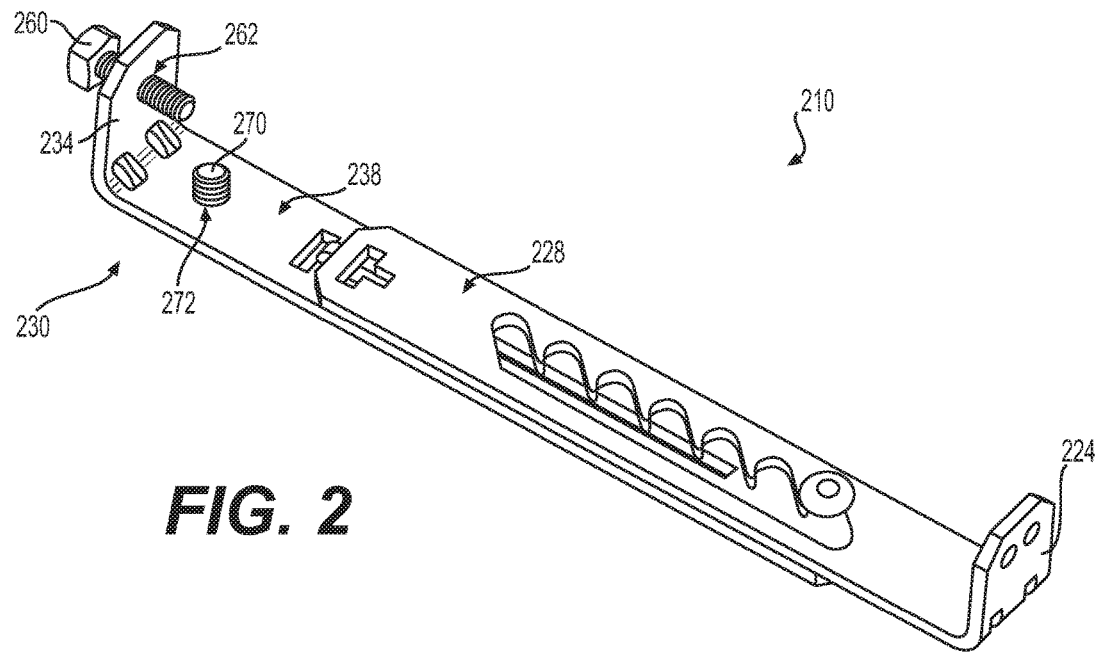
FIG. 2 is a perspective view of an exemplary meter box grounding clamp in a first configuration in accordance with various aspects of the disclosure.
Figure 3:
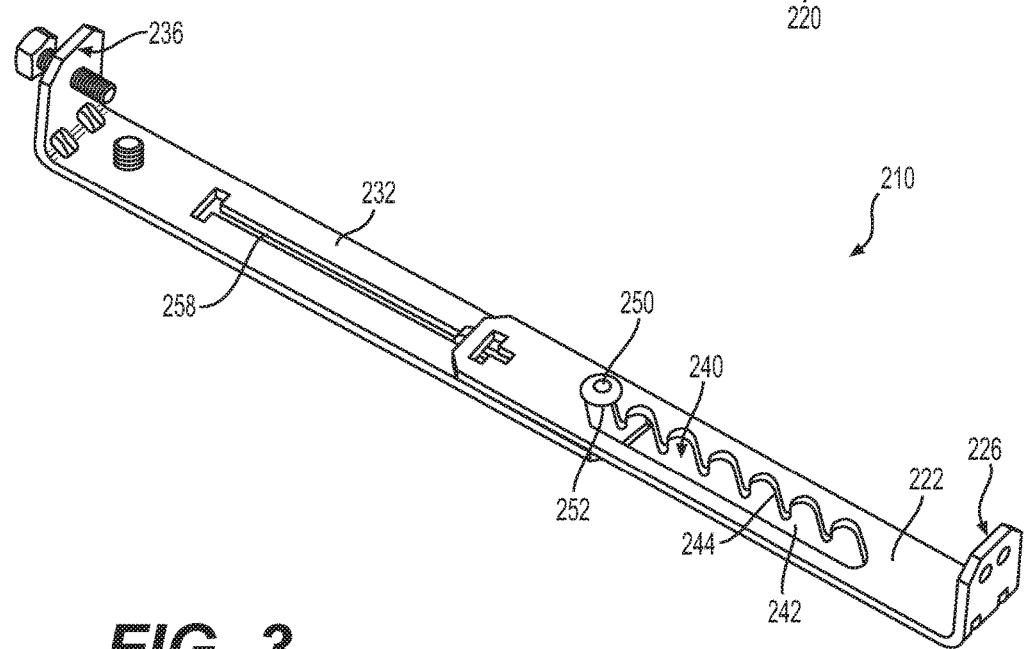
FIG. 3 is a perspective view of the exemplary meter box grounding clamp of FIG. 2 in a second configuration.

Referring to FIG. 1, an exemplary meter box grounding clamp 10 in accordance with various aspects of the disclosure is illustrated. The grounding clamp 10 includes a first clamping member 20 and a second clamping member 30. The first and second clamping members 20, 30 are coupled together to form the C-shaped clamp 10 that is attachable to a meter box (not shown). The clamp 10 may also be considered U-shaped.

The first clamping member 20 includes a first base 22 and a first arm 24 extending perpendicular from the first base 22. Similarly, the second clamping member 30 includes a second base 32 and a second arm 34 extending from the second base 32. When the first and second clamping members 20, 30 are coupled together to form the C-shaped clamp 10, the first and second bases 22, 32 are parallel to one another in close proximity, while the first and second arms 24, 34 are parallel to one another and spaced apart by a predetermined distance. The first and second arms 24, 34 are generally of the same shape and have first and second inner surfaces 26, 36, respectively, that substantially oppose each other.

The first base 22 and the second base 32 are elongated members secured to each other to form an elongated base 12 of the C-shaped clamp 10. The first base 22 and the second base 32 are secured to each other in a manner such that the first base 22 and the second base 32 are movable relative to one another. Thus, a length of the elongated base 12 can be adjusted by moving the first base 22 relative to the second base 32 such that the first and second arms 24, 34 are moved closed to one another or farther apart from one another.

For example, the first clamping member 20 may include a cutout 40. The cutout 40 may include an elongated slot 42 extending in a longitudinal direction of the elongated first base 22. The cutout 40 may also include a plurality of notches 44 in the first base 22 that are spaced sequentially along a length of the elongated slot 42 and extend at an oblique angle relative to the length of the elongated slot 42. The notches 44 may be formed by a series of angled flutes 46 also spaced sequentially along a length of the elongated slot 42.

The clamp 10 includes at least one coupling member 50 fixedly coupled with the second base 32. Each coupling member 50 includes a head 52 connected with a pin 54. The pin 54 has a length selected such that when the pin 54 is fixedly mounted to the second base 32, the pin 54 extends from a surface 38 of the second base 32 by a length that is equal to or slightly greater than the thickness of the first base 22. The head 52 is thus adjacent a surface 28 of the first base 22. It may be desirable to design the coupling member 50 such that the head 52 is slightly spaced from the surface 28 of the first base 22.

In some aspects, the coupling member 50 may be a screw or a bolt that can be removably inserted into a threaded receiving hole (not shown) in the second base 32. In such embodiments, the screw or bolt can be removed from the second base 32, and the first base 22 and the second base 32 can be decoupled from one another. In other embodiments, the coupling member 50 may be a rivet or other faster that is designed to not be removed from the second base 32. In such embodiments, the clamp 10 is designed such that the first base 22 and the second base 32 are not decoupleable from one another.

As shown in FIG. 1, the clamp 10 may include two coupling members 50 spaced apart in the longitudinal direction of the elongated second base 32. The coupling members 50 extend perpendicular from the surface 38 of the second base 32 and extend through the cutout 40 in the first base 22. The spacing between the coupling members 50 is fixed and corresponds with the spacing between two of the notches 44 in the first base 22. For example, the two coupling members may be spaced apart by the distance between the centers of two adjacent notches 44 or by the distance between the centers of two notches 44 that themselves are separated by one or more notches 44. It may be preferable for the clamp to include two coupling members 50 in order to allow some relative rotation but limiting relative rotation between the clamping members 20, 30, thereby facilitating installation on a meter box.

The coupling members 50 couple the first base 22 and the second base 32 to one another such that the longitudinal dimension of the first base 22 and the second base 32 are aligned and the first base 22 and the second base 32 are slidably movable relative to one another in the longitudinal direction of the clamp 10. The first base 22 and the second base 32 are also slidably movable relative to one another in a direction transverse to the longitudinal direction of the clamp 10 such that the coupling members 50 can be received by notches 44 in the first base 22 and removed from the notches 44 in the first base 22. When the coupling members 50 are received by notches 44 in the first base 22, the first base 22 and the second base 32 are permitted to move relative to one another in a first direction such that the first art 24 and the second arm 34 move away from one another, but are prevented from moving in a second direction opposite to the first direction. When the first base 22 and the second base 32 are moved in the first direction, the angled flutes 46 guide the pins 54 of the coupling members 50 in a transverse direction toward the elongated slot 42.

In one exemplary embodiment, the notches 44 and pins 54 are spaced apart at predetermined increments to create a plurality of discrete, predetermined lengths of the base 12 of the clamp 10. For example, notches may be spaced at one-half inch intervals, center-to-center, from each other so that the base 10 can be adjusted at one-half inch increments. Corresponding, the pins 54 would be spaced from one another by one-half inch or any multiple of one-half inch. For example, two pins can be spaced one inch apart. To accommodate for minor adjustments between the discrete sizes of the C-shaped clamp 10 and the length of the meter box, the clamp include a set screw 60 threadedly received through a threaded opening 62 in the second arm 34. The set screw 60 can be moved into pressure engagement with the bottom of the meter box. In some aspects, the end of the screw 60 may be pointed to minimize any torque that may otherwise be transmitted to the clamp 10 and inadvertently cause the clamp to turn.

In use, the first and second base members 22, 32 are movable relative to one another such that the base 12 of the C-shaped clamp 10 has a length that is larger than a side of a meter box to which it is to be attached. The first and second base members 22, 32 should be positioned to the smallest possible length where the arms 24, 34 are beyond opposing ends of the meter box. Advantageously, when the first and second clamping members 20, 30 are coupled together by the coupling member 50 to form the C-shaped clamp, the length of the base 12 of the clamp 10 can be easily adjusted with one hand of a user while the first and second clamping members 20, 30 remain coupled to one another. The first arm 24 can then engage one end, e.g., a top wall, of the meter box, and the second arm 34 will be spaced from an opposite second end, e.g., a bottom wall, of the meter box. The set screw 60 can then be threaded through the threaded opening 62 to accommodate for minor adjustments between the discrete sizes of the C-shaped clamp 10 and the length of the meter box. For example, the clamp is adjustable in one-half inch increments, the set screw 60 should be sized to allow for adjustment up to one-half inch.

Referring now to FIGS. 2-6, an exemplary meter box grounding clamp 210 in accordance with various aspects of the disclosure is illustrated. The grounding clamp 210 includes a first clamping member 220 and a second clamping member 230. The first and second clamping members 220, 230 are coupled together to form the C-shaped clamp 210 that is attachable to a meter box (not shown). The clamp 210 may also be considered U-shaped.

The first clamping member 220 includes a first base 222 and a first arm 224 extending perpendicular from the first base 222. Similarly, the second clamping member 230 includes a second base 232 and a second arm 234 extending from the second base 232. When the first and second clamping members 220, 230 are coupled together to form the C-shaped clamp 210, the first and second bases 222, 232 are parallel to one another in close proximity, while the first and second arms 224, 234 are parallel to one another and spaced apart by a predetermined distance. The first and second arms 224, 234 are generally of the same shape and have first and second inner surfaces 226, 236, respectively, that substantially oppose each other.

The first base 222 and the second base 232 are elongated members secured to each other to form an elongated base 212 of the C-shaped clamp 210. The first base 222 and the second base 232 are secured to each other in a manner such that the first base 222 and the second base 232 are movable relative to one another. Thus, a length of the elongated base 212 can be adjusted by moving the first base 222 relative to the second base 32 such that the first and second arms 224, 234 are moved closer to one another or farther apart from one another.

For example, the first clamping member 220 may include a cutout 240. The cutout 240 may include an elongated slot 242 extending in a longitudinal direction of the elongated first base 222. The cutout 240 may also include a plurality of notches 244 in the first base 222 that are spaced sequentially along a length of the elongated slot 242 and extend at an oblique angle relative to the length of the elongated slot 242. The notches 244 may be formed by a series of angled flutes 246 also spaced sequentially along a length of the elongated slot 242.

The clamp 210 includes a coupling member 250 fixedly coupled with the second base 232. The coupling member 250 includes a head 252 connected with a pin 254. The pin 254 has a length selected such that when the pin 254 is fixedly mounted to the second base 232, the pin 254 extends from a surface 238 of the second base 232 by a length that is equal to or slightly greater than the thickness of the first base 222. The head 252 is thus adjacent a surface 228 of the first base 222. It may be desirable to design the coupling member 250 such that the head 252 is slightly spaced from the surface 228 of the first base 222 to avoid excessive friction between the first and second bases 222, 232 when the bases 222, 232 are slidably moved relative to one another.

In some aspects, the coupling member 250 may be a screw or a bolt that can be removably inserted into a threaded receiving hole 256 in the second base 232. In such embodiments, the screw or bolt can be removed from the second base 232, and the first base 222 and the second base 232 can be decoupled from one another. In other embodiments, the coupling member 250 may be a rivet or other faster that is designed to not be removed from the second base 232. In such embodiments, the clamp 210 is designed such that the first base 222 and the second base 232 are not decoupleable from one another. The coupling member 250 extends perpendicular from the surface 238 of the second base 232 and extends through the cutout 240 in the first base 222.

As shown in FIGS. 2-6, the second base 232 may include an elongated slot 258 extending in a longitudinal direction of the elongated second base 232. The first base 222 includes a coupling member 248 extending from the first base 222 in a direction opposite to the direction in which the first arm 224 extends. The coupling member 248 is spaced apart from the cutout 240 in the longitudinal direction of the elongated first base 222 at an end of the first base 222 opposite to the first arm 224.

Figure 5:
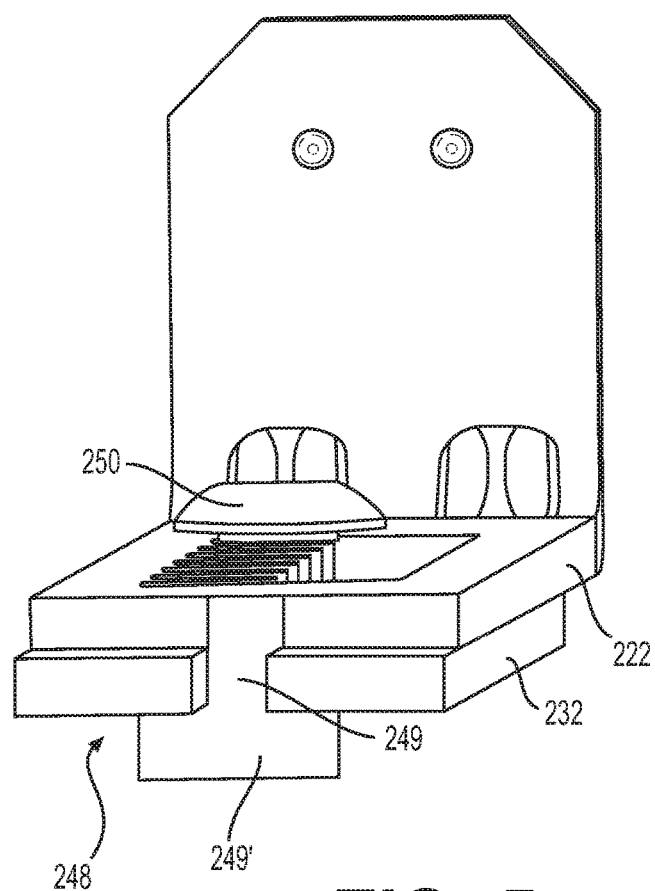
FIG. 5 is an exploded view of the exemplary meter box grounding clamp of FIG. 2.
Figure 6:
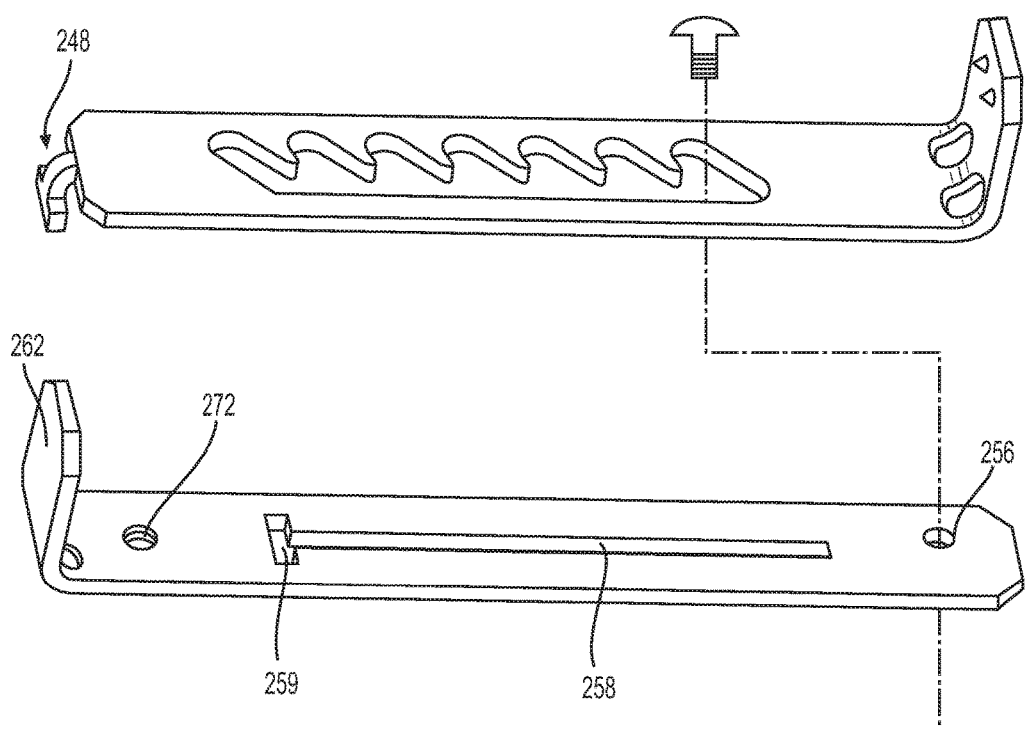
FIG. 6 is a cross-sectional end view of the exemplary meter box grounding clamp of FIG. 2.

As best shown in FIGS. 5 and 6, the coupling member 248 may be T-shaped, having a first portion 249 extending perpendicular from the surface 228 of the first base 222 and extending through the slot 258 in the second base 232, and a second portion 249' extending substantially perpendicular to the first portion 249. The elongated slot 258 in the second base 232 may include a transverse portion 259 at one end. The transverse portion 259 is sized such that the second portion 249' of the coupling member 248 may be inserted through the transverse portion 259 such that the first base 222 and the second base 232 can lie next to one another and be relatively slidable as guided by the first portion 249 of the coupling member cooperating with the elongated slot 258.

Figure 4:
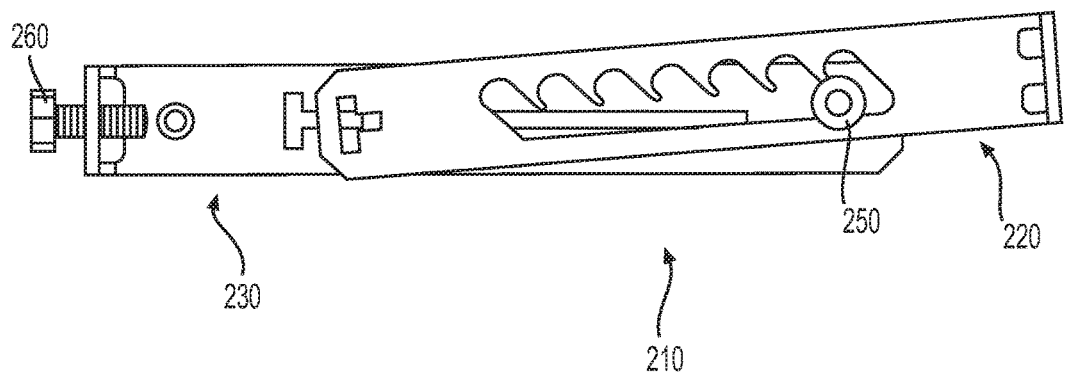
FIG. 4 is a perspective view of the exemplary meter box grounding clamp of FIG. 2 in a second configuration.

The coupling members 248, 250 couple the first base 222 and the second base 232 to one another such that the longitudinal dimension of the first base 222 and the second base 232 are aligned and the first base 222 and the second base 232 are slidably movable relative to one another in the longitudinal direction of the clamp 210. As shown in FIG. 4, the first base 222 and the second base 232 are also pivotably movable relative to one another in a plane transverse to the longitudinal direction of the clamp 210 such that the coupling member 250 can be selectively inserted into one of the notches 244 in the first base 222 and removed from the notches 244 in the first base 222. When the coupling member 250 is received by one of the notches 244 in the first base 222, the first base 222 and the second base 232 are permitted to move relative to one another in a first direction such that the first art 224 and the second arm 234 move away from one another, but are prevented from moving in a second direction (i.e., toward one another), which is opposite to the first direction. When the first base 222 and the second base 232 are moved in the first direction, the angled flutes 246 guide the pin 254 of the coupling member 250 in a transverse direction toward the elongated slot 242.

In one exemplary embodiment, the notches 244 and pin 254 are spaced apart at predetermined increments to create a plurality of discrete, predetermined lengths of the base 212 of the clamp 210. For example, notches may be spaced at one-half inch intervals, center-to-center, from each other so that the base 210 can be adjusted at one-half inch increments. Corresponding, the pin 254 would be spaced from one another by one-half inch or any multiple of one-half inch. For example, two pins can be spaced one inch apart. To accommodate for minor adjustments between the discrete sizes of the C-shaped clamp 210 and the length of the meter box, the clamp include a set screw 260 threadedly received through a threaded opening 262 in the second arm 234. The set screw 260 can be moved into pressure engagement with the bottom of the meter box. In some aspects, the end of the screw 260 may be pointed to minimize any torque that may otherwise be transmitted to the clamp 210 and inadvertently cause the clamp to turn.

In use, the first and second base members 222, 232 are movable relative to one another such that the base 212 of the C-shaped clamp 210 has a length that is larger than a side of a meter box to which it is to be attached. The first and second base members 222, 232 should be positioned to the smallest possible length where the arms 224, 234 are beyond opposing ends of the meter box. Advantageously, when the first and second clamping members 220, 230 are coupled together by the coupling members 248, 250 to form the C-shaped clamp, the length of the base 212 of the clamp 210 can be easily adjusted with one hand of a user while the first and second clamping members 220, 230 remain coupled to one another. The first arm 224 can then engage one end, e.g., a top wall, of the meter box, and the second arm 234 will be spaced from an opposite second end, e.g., a bottom wall, of the meter box. The set screw 260 can then be threaded through the threaded opening 262 to accommodate for minor adjustments between the discrete sizes of the C-shaped clamp 210 and the length of the meter box. For example, the clamp is adjustable in one-half inch increments, the set screw 260 should be sized to allow for adjustment up to one-half inch.

The grounding clamp 10, 210 also includes a grounding screw 70 threaded through a threaded opening 72 in the clamp 10, 210. It some aspects, it may be preferable to thread the grounding screw 70 through the second base 32, 232 so that the grounding screw 70 is easily accessible to a user for attaching a wire to be grounded. The grounding screw 70 may be provided with any conventional mechanism for connecting a ground wire.

In some aspects, the first arm 24, 224 may include one or more projections 80. The projections 80 may be frustoconical or pyramid-shaped with a pointed end. The point ends are sufficiently hardened to cut through any electrically nonconductive layer, such as paint, on the surface of meter box and to engage in good electrical and mechanical contact with metal surface of the meter box. Further, the set screw 60 and/or the grounding screw 70 may be provided with tips or points configured to scratch and cut through any outer nonconductive coating into the metal of the meter box when the respective screw 60, 70 is tightened in order to provide greater direct electrical and mechanical contact with the metal of the meter box. The projections 80 and/or the screws 60, 70 may prevent inadvertent movement or "walking" of the clamp 10, 210 relative to the meter box.

The foregoing description of exemplary embodiments provides illustration and description, but is not intended to be exhaustive or to limit the embodiments described herein to the precise form disclosed. Modifications and variations are possible in light of the above teachings or may be acquired from practice of the embodiments.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A clamping device for mechanical and electrical connection to sides of a conductor, the clamping device comprising:
    a first clamping portion having a first base portion and a first arm portion; and
    a second clamping portion having a second base portion and a second arm portion; and
    a coupling portion configured to operably couple the first clamping portion with the second clamping portion,
    wherein the coupling portion is configured to permit the first clamping portion and the second clamping portion to pivot relative to one another between a first orientation, where the first base portion and the second base portion extend parallel to one another along a longitudinal direction, and a second orientation, where the first base portion and the second base portion do not extend parallel to one another along the longitudinal direction,
    wherein, in the first orientation, the coupling portion is configured to prevent relative sliding movement between the first clamping portion and the second clamping portion in a first direction where the first arm portion and the second arm portion move away from one another and permit relative sliding movement between the first clamping portion and the second clamping portion in a second direction where the first arm portion and the second arm portion move toward one another, wherein, in the second orientation, the coupling portion is configured to permit relative sliding movement between the first clamping portion and the second clamping portion in the first direction and the second direction,
    wherein a first portion of the coupling portion is configured to slide with the first clamping portion relative to the second clamping portion, and a second portion of the coupling portion is configured to slide with the second clamping portion relative to the first clamping portion,
    wherein the coupling portion is configured to limit a range of the relative sliding between the first clamping portion and the second clamping portion in the longitudinal direction,
    wherein the first base portion and the second base portion are configured to overlap one another so that the relative sliding between the first clamping portion and the second clamping portion adjusts a distance between the first arm portion and the second arm portion in the longitudinal direction,
    wherein the coupling portion is configured to set the distance between the first arm portion and the second arm portion to one of a predetermined number of distances in the first orientation,
    wherein the first arm portion and the second arm portion are configured to clamp the conductor there between, and
    wherein the coupling portion is configured to prevent decoupling of the first clamping portion and the second clamping portion before operation of the clamping device, during operation of the clamping device, and after operation of the clamping device.

2. A clamping device for mechanical and electrical connection to sides of a conductor, the clamping device comprising:
    a first clamping portion having a first base portion and a first arm portion; and
    a second clamping portion having a second base portion and a second arm portion; and
    a coupling portion configured to operably couple the first clamping portion with the second clamping portion,
    wherein the coupling portion is configured to permit the first clamping portion and the second clamping portion to pivot relative to one another between a first orientation, where the first base portion and the second base portion extend parallel to one another along a longitudinal direction, and a second orientation, where the first base portion and the second base portion do not extend parallel to one another along the longitudinal direction,
    wherein, in the first orientation, the coupling portion is configured to prevent relative sliding movement between the first clamping portion and the second clamping portion in a direction where the first arm portion and the second arm portion move away from one another, wherein, in the second orientation, the coupling portion is configured to permit relative sliding movement between the first clamping portion and the second clamping portion in the direction where the first arm portion and the second arm portion move away from one another, wherein the coupling portion is configured to limit a range of the relative sliding movement between the first clamping portion and the second clamping portion in the longitudinal direction, wherein the coupling portion is configured to set the distance between the first arm portion and the second arm portion to one of a predetermined number of distances in the first orientation, wherein the first arm portion and the second arm portion are configured to clamp the conductor there between, and wherein the coupling portion is configured to prevent decoupling of the first clamping portion and the second clamping portion before operation of the clamping device, during operation of the clamping device, and after operation of the clamping device.

3. The clamping device of claim 2, further comprising an adjustment portion configured to be threadedly received through a threaded opening in the first arm portion or the second arm portion for engagement with an adjacent side of the conductor.

4. The clamping device of claim 3, wherein a length of the adjustment portion is greater than individual discrete adjustment increments between the first clamping portion and the second clamping portion to provide a continuous range of adjustments for different width conductors.

5. The clamping device of claim 2, wherein the coupling portion includes a first coupling portion configured to extend from the first clamping portion through an elongated slot in the second clamping portion.

6. The clamping device of claim 5, wherein the coupling portion includes a second coupling portion configured to extend from the second clamping portion through an elongated slot in the first clamping portion.

7. The clamping device of claim 6, wherein the second coupling portion is configured to prevent decoupling of the first clamping portion from the second clamping portion.

8. The clamping device of claim 6, wherein the second coupling portion extends from the second base portion at an end of the second base portion that is opposite to the second arm portion.

9. The clamping device of claim 8, wherein the elongated slot in the first clamping portion is between the first arm portion and the first coupling portion, and the elongated slot in the second clamping portion is between the second arm portion and the second coupling portion.

10. A clamping device for mechanical and electrical connection to sides of a conductor, the clamping device comprising:

a first clamping portion having a first base portion and a first arm portion; and a second clamping portion having a second base portion and a second arm portion; and wherein the first clamping portion and the second clamping portion are configured to be operably coupled to one another, wherein the first clamping portion is configured to pivot relative to the second clamping portion between a first orientation, where the first base portion and the second base portion extend parallel to one another along a longitudinal direction, and a second orientation, where the first base portion and the second base portion do not extend parallel to one another along the longitudinal direction, wherein, in the first orientation, the first clamping portion and the second clamping portion are prevented from sliding relative to one another in a direction where the first arm portion and the second arm portion move away from one another, wherein, in the second orientation, the first clamping portion and the second clamping portion are permitted to slide relative to one another in the direction where the first arm portion and the second arm portion move away from one another, wherein the first clamping portion and the second clamping portion are configured to set a distance between the first arm portion and the second arm portion to one of a predetermined number of distances in the first orientation, and wherein the first arm portion and the second arm portion are configured to clamp the conductor there between.

11. The clamping device of claim 10, wherein the first clamping portion and the second clamping portion are configured to prevent decoupling of the first clamping portion and the second clamping portion before operation of the clamping device, during operation of the clamping device, and after operation of the clamping device.

12. The clamping device of claim 10, further comprising an adjustment portion configured to be threadedly received through a threaded opening in the first arm portion or the second arm portion for engagement with an adjacent side of the conductor.

13. The clamping device of claim 12, wherein a length of the adjustment portion is greater than individual discrete adjustment increments between the first clamping portion and the second clamping portion to provide a continuous range of adjustments for different width conductors.

14. The clamping device of claim 10, wherein the first clamping portion includes a first coupling portion configured to extend from the first clamping portion through an elongated slot in the second clamping portion.

15. The clamping device of claim 14, wherein the second clamping portion includes a second coupling portion configured to extend from the second clamping portion through an elongated slot in the first clamping portion.

16. The clamping device of claim 15, wherein the second coupling portion is configured to prevent decoupling of the first clamping portion from the second clamping portion.

17. The clamping device of claim 15, wherein the second coupling portion extends from the second base portion at an end of the second base portion that is opposite to the second arm portion.

18. The clamping device of claim 17, wherein the elongated portion in the first clamping portion is between the first arm portion and the first coupling portion, and the elongated slot in the second clamping portion is between the second arm portion and the second coupling portion.

* * * * *